(12) United States Patent
Carl et al.

(10) Patent No.: US 11,269,260 B2
(45) Date of Patent: Mar. 8, 2022

(54) METHOD AND ASSEMBLY FOR CHARACTERIZING A MASK OR A WAFER FOR MICROLITHOGRAPHY

(71) Applicant: Carl Zeiss SMT GmbH, Oberkochen (DE)

(72) Inventors: Michael Carl, Aalen (DE); Martin Voelcker, Koenigsbronn-Zang (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 17/164,747

(22) Filed: Feb. 1, 2021

(65) Prior Publication Data

US 2021/0157243 A1 May 27, 2021

Related U.S. Application Data

(63) Continuation of application No. PCT/EP2019/069910, filed on Jul. 24, 2019.

(30) Foreign Application Priority Data

Aug. 6, 2018 (DE) .......................... 102018213127.9

(51) Int. Cl.
G03F 7/20 (2006.01)

(52) U.S. Cl.
CPC .............. *G03F 7/705* (2013.01); *G03F 7/702* (2013.01); *G03F 7/7065* (2013.01); *G03F 7/7085* (2013.01); *G03F 7/70625* (2013.01)

(58) Field of Classification Search
CPC ...... G03F 7/702; G03F 7/705; G03F 7/70625; G03F 7/7065; G03F 7/7085; G03F 7/703;

(Continued)

(56) References Cited

U.S. PATENT DOCUMENTS 8,918,743 B1 12/2014 Yan et al.
9,116,120 B2 8/2015 Rodenburg
(Continued)

FOREIGN PATENT DOCUMENTS

KR 20130017189 A 2/2013
WO WO 2017/207297 A1 12/2017

OTHER PUBLICATIONS

Thibault et al.: "Probe retrieval in ptychographic coherent diffractive imaging", *Ultramicroscopy* 109 (2009): 338-343. doi: 10.1016/j.ultramic.2008.12.011.

(Continued)

*Primary Examiner* — Christina A Riddle
(74) *Attorney, Agent, or Firm* — Fish & Richardson P.C.

(57) ABSTRACT

A method includes using an illumination device to illuminate an object with electromagnetic radiation produced by a radiation source, and using a detector device to capture a respective intensity distribution in a diffraction image produced by the object in a plurality of measurement steps. The measurement steps differ from one another with respect to the illumination setting set by the illumination device. The method also includes determining at least one characteristic variable that is characteristic for the object on the basis of an iteratively performed comparison between the measurement values obtained within the scope of the measurement steps and model-based simulated values. The model-based simulated values are ascertained on the basis of a multiple layer model, in which the object is modeled by a multiple layer structure made of layers that are respectively separated from one another by an interface, wherein a location-dependent reflectivity is assigned to the interfaces.

20 Claims, 5 Drawing Sheets

(58) Field of Classification Search
CPC .. G03F 7/70483–7541; G03F 7/70591–70683; G03F 1/84; G03F 1/68; G03F 1/72; G03F 1/82; G01N 21/9501; G01N 21/956; G01N 2021/95676; G06T 2200/08; G06T 17/00–30; G06T 2219/20; G06T 2215/06
USPC ......... 355/30, 52–77, 133; 250/492.1–492.3, 250/493.1, 503.1, 504 R; 356/237.1–237.6, 601–624, 625–640; 702/33–36, 40, 81, 155, 166, 167, 170, 702/172, 189–199

See application file for complete search history.

(56) References Cited

U.S. PATENT DOCUMENTS

| | | | |
|---|---|---|---|
| 2006/0007362 A1* | 1/2006 | Lee .................... | H04N 9/3129 348/744 |
| 2007/0105029 A1* | 5/2007 | Ausschnitt ......... | G03F 7/70633 430/30 |
| 2010/0245807 A1* | 9/2010 | Li ........................ | G01B 11/24 356/152.1 |
| 2013/0181990 A1 | 7/2013 | Rodenburg et al. | |
| 2014/0375981 A1 | 12/2014 | Wang et al. | |
| 2016/0139034 A1* | 5/2016 | Mikami ............... | G01J 3/4412 702/189 |
| 2016/0273906 A1 | 9/2016 | Pisarenco et al. | |
| 2017/0045823 A1 | 2/2017 | Quintanilha | |
| 2018/0046087 A1 | 2/2018 | Iff et al. | |

OTHER PUBLICATIONS

A. Maiden, M. Humphry, and J. Rodenburg: "Ptychographic transmission microscopy in three dimensions using a multi-slice approach", J. Opt. Soc. Am. A, vol. 29, No. 8, Aug. 2012, pp. 1606-1614.

Lei Tian and Laura Waller: "3D intensity and phase imaging from light field measurements in an LED array microscope", vol. 2, No. 2 / Feb. 2015 / Optica.

R. W. Gerchberg and W. O. Saxton: "A practical Algorithm for the Determination of Phase from Image and Diffraction Plane Pictures" Optik, vol. 35, No. 2, 237-246 (1972).

Jianwei Miao et al.: "Beyond crystallography: Diffractive imaging using coherent x-ray light sources", Science, May 1, 2015, vol. 348, Issue 6234.

Dennis F. Gardner et al.: "High numerical aperture reflection mode coherent diffraction microscopy using off-axis apertured illumination", Aug. 13, 2012, vol. 20, No. 17, Optics Express 19050.

S. Schmidt et al.: "Wave-optical modeling beyond the thin-element-approximation", vol. 24 No. 26, Dec. 26, 2016, Optics Express 30188.

Sandra Stephan: "High-Resolution 3D Ptychography", Dissertation, Technische Universität Dresden, Apr. 15, 2013 (Abstract only).

M. Fertig and K.-H. Brenner: "Vector wave propagation method", vol. 27, No. 4, Apr. 2010, J. Opt. Soc. Am. A, pp. 709-717.

Kevin S. Raines et al.: "Three-dimensional structure determination from a single view" Nature, 2009, vol. 463(7278).

A. M. Maiden et al.: "Superresolution imaging via ptychography", J. Opt. Soc. Am. A, vol. 28, No. 4, Apr. 2011, pp. 604-612.

B. Zhang et al.: "Quantitative tabletop coherent diffraction imaging microscope for EUV lithography mask inspection", Proc. of SPIE, vol. 9050, 90501D, 2014.

G.S.M. Jansen et al.: "Spatially resolved Fourier transform spectroscopy in the extreme ultraviolet", Optica, vol. 3, No. 10, Oct. 2016.

M. Tanksalvala et al.: "Sub-wafelength transmission and reflection-mode tabletop imaging with 13nm illumination via ptychography CDI", Proc. of SPIE, vol. 10145, 101450L-1.

IPRP, with translation thereof, for corresponding Appl No. PCT/EP2019/069910, dated Feb. 9, 2021.

GPTO—Office Action, with translation thereof, for corresponding DE 10 2018 213 127.9, dated Apr. 16, 2019.

Translation of International Search Report for corresponding Appl No. PCT/EP2019/069910, dated Nov. 27, 2019.

Kim Yong Soo et al., "Actinic EUV mask inspection using coherent EUV source based on high-order harmonic generation", 2015 11th Conference on Lasers and Electro-Optics Pacific Rim (CLEO-PR), IEEE, Bd. 2, 24. Aug. 2015.

Seong-Sue Kim et al., "Optical properties of a thin-film stack illuminated by a focused field Sung-Chul Shin," Aug. 1, 2000 (Aug. 1, 2000). Retrieved from the Internet: https://www.osapublishing.org/DirectPDFAccess/IEEC5B9F-0E8C-D5A8-9DA7F6871F47455B_61860/josaa-1 7-8-1454.pdf?da=1&id=61860&seq=0&mobile=no [retrieved on Nov. 4, 2019] XP055638530.

Wouter van den Broek and Christoph T. Koch, "General framework for quantitative three-dimensional reconstruction from arbitrary detection geometries in TEM", Physical Review B 87, 184108 (2013).

\* cited by examiner

METHOD AND ASSEMBLY FOR CHARACTERIZING A MASK OR A WAFER FOR MICROLITHOGRAPHY

CROSS-REFERENCE TO RELATED APPLICATIONS

The present application is a continuation of, and claims benefit under 35 USC 120 to, international application PCT/EP2019/069910, filed Jul. 24, 2019, which claims benefit under 35 USC 119 of German patent application DE 10 2018 213 127.9, filed on Aug. 6, 2018. The entire disclosure of these applications are incorporated by reference herein.

FIELD

The disclosure relates to a method and an arrangement for characterizing a microlithographic wafer or mask.

BACKGROUND

Microlithography is used for the production of microstructured components, such as for example integrated circuits or LCDs. The microlithography process is conducted in what is called a projection exposure apparatus, which includes an illumination device and a projection lens. The image of a mask (=reticle) illuminated via the illumination device is in this case projected via the projection lens onto a substrate (e.g. a silicon wafer) that is coated with a light-sensitive layer (photoresist) and arranged in the image plane of the projection lens in order to transfer the mask structure to the light-sensitive coating of the substrate.

Unwanted defects on the mask can be disadvantageous in the lithography process as these defects may be reproduced in each exposure step and hence, in a worst-case scenario, there is the risk of the entire output of semiconductor components being unusable. Therefore, it can be desirable to comprehensively characterize the mask and check the mask has a sufficient imaging capability prior to the use thereof within the scope of mass production. However, characterizing masks or else wafers in three dimensions can represent a particular challenge.

Figure 5:
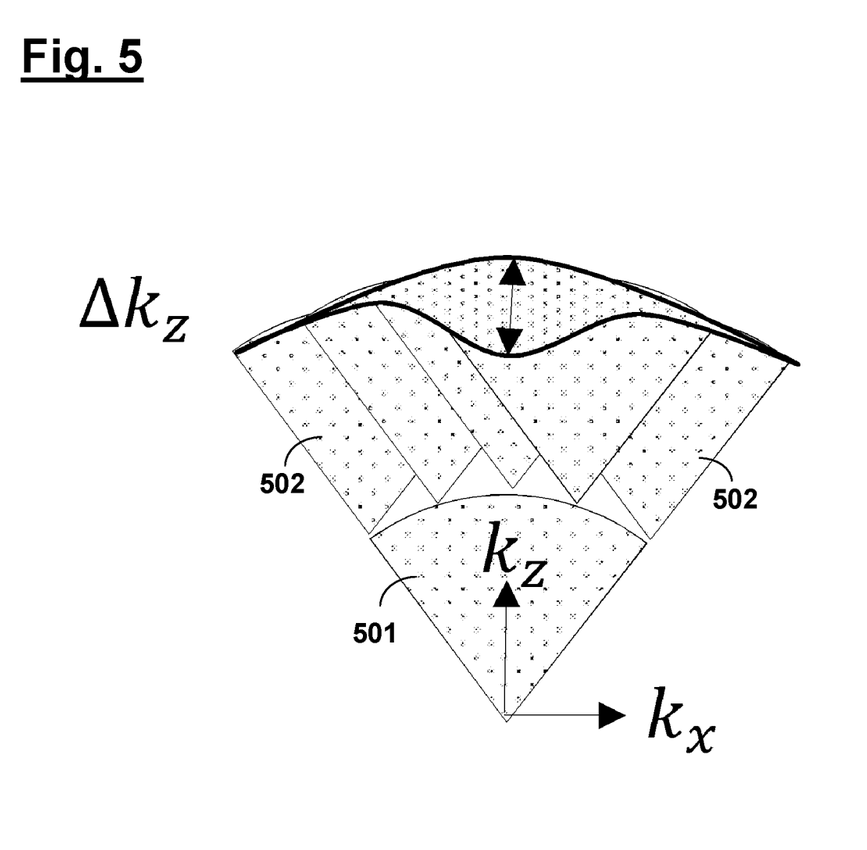
FIG. 5 shows a schematic illustration for explaining a problem addressed by the present disclosure.

Resolving in three dimensions can involve an object illumination with a comparatively high numerical aperture (i.e., realizing correspondingly large angle of incidence ranges of the electromagnetic radiation incident on the object to be characterized). This is illustrated only schematically in FIG. 5, wherein the angle range generated in the illumination is denoted by "501" and the angle range produced in the projection optical unit is denoted by "502". However, a rotation of the relevant object, for example, which is customary for the realization of large angle of incidence ranges, may not be desirable, for instance in the case of the wafer or the associated wafer stage, under certain circumstances.

A three-dimensional microscopic characterization may not be possible in transmission in the case of work wavelengths in the x-ray range (e.g., in the case of work wavelengths of approximately 2 nm) on account of the absorption effect of the respective, typically used substrate materials.

Examples of disclosure are provided, for example in: US 2017/0045823 A1; US 2014/0375981 A1; Thibault et al.: "*Probe retrieval in ptychographic coherent diffractive imaging*", Ultramicroscopy, 2009; 109(4):338-43. doi: 10.1016/j.ultramic.2008.12.011; A. Maiden, M. Humphry, and J. Rodenburg: "*Ptychographic transmission microscopy in three dimensions using a multi-slice approach*", JOSA A, Vol. 29, No. 8, 2012; Lei Tian et al.: "*3D intensity and phase imaging from light field measurements in an LED array microscope*", Vol. 2, No. 2/February 2015/Optica; R. W. Gerchberg et al.: "*A practical algorithm for the determination of phase from image and diffraction plane pictures*" Optik 35, 237-250 (1972); Jianwei Miao et al.: "*Beyond crystallography: Diffractive imaging using coherent x-ray light sources*", Science, Vol. 348 Issue 6234, and Dennis F. Gardner et al.: "*High numerical aperture reflection mode coherent diffraction microscopy using off-axis apertured illumination*", 2012, Vol. 20, No. 17, OPTICS EXPRESS 19050.

SUMMARY

The present disclosure seeks to provide a method and an arrangement for characterizing a microlithographic wafer or mask, which facilitate a characterization in three dimensions while avoiding the aforementioned problems.

In an aspect, the disclosure provides a method for characterizing an object in the form of a microlithographic wafer or mask, wherein the method includes the following steps:
  using an illumination device to illuminate the object with electromagnetic radiation produced by a radiation source;
  using a detector device to capture a respective intensity distribution in a diffraction image produced by the object in a plurality of measurement steps, wherein the measurement steps differ from one another with respect to the illumination setting set by the illumination device;
  determining at least one characteristic variable that is characteristic for the object on the basis of an iteratively performed comparison between the measurement values obtained within the scope of the measurement steps and model-based simulated values;
  wherein the model-based simulated values are ascertained on the basis of a multiple layer model, in which the object is modeled by a multiple layer structure made of layers that are respectively separated from one another by an interface, wherein a location-dependent reflectivity is assigned to the interfaces; and
  wherein the illumination device and the detector device are arranged on the same side of the object such that the diffraction image is captured in reflection.

A three-dimensional refractive index profile of the object is reconstructed in embodiments of the disclosure.

The disclosure is based, in part, on the concept of realizing a three-dimensional characterization of a microlithographic wafer or mask in reflection, wherein, firstly, a suitable algorithm is provided for evaluating the measurement results obtained with the setup according to the disclosure and, secondly, a sufficient resolution is facilitated by providing a comparatively high aperture illumination (e.g., with a numerical aperture of at least 0.3, in particular of at least 0.4).

Here, the disclosure contains, in part, the further concept of basing the model description of the object to be characterized (i.e., the mask or the wafer) on a multiple layer model, wherein the refractive index of the object varies parallel to the object plane (i.e., in the x-direction and/or y-direction) but is constant within the individual layers in the direction perpendicular to the object plane (z-direction).

Expressed differently, according to the disclosure, the modeling of the object to be characterized can provide a simplification inasmuch as a variation of the refractive index in the z-direction is not continuous but occurs in steps. With respect to the further specific configuration of the model in relation to the propagation of the electromagnetic radiation within the individual layers (with a respective constant refractive index in the z-direction), different embodiments are possible here; aspects will be explained in more detail below. What is common to these model descriptions of the object to be characterized is that there is a respective specification as to how the diffraction image to be expected should be calculated from a given input wave.

On the basis of this model description, there subsequently is by way of an iteration a repeated comparison between the model-based simulated values and the measurement values captured with the aid of the detector device within the scope of the measurement according to the disclosure, wherein, in a manner known per se and in a multiplicity of iteration steps, there respectively is in repeated fashion a forward calculation or forward simulation (corresponding to the model-based calculation of a diffraction image) and an inverse calculation (corresponding to a correction of the underlying model on the basis of the actually obtained measurement results).

As a result, a three-dimensional microscopic characterization in reflection with a comparatively high resolution can be obtained on the basis of a suitable approximation of the object to be characterized (i.e., the mask or the wafer) by way of a multiple layer system, wherein any coherent illumination setting can be processed as a matter of principle.

According to some embodiments, the method further includes a reconstruction of interface reflectivities in the multiple layer structure of the object.

According to some embodiments, the method further includes a reconstruction of an illumination field produced by the illumination device.

According to some embodiments, a propagation between two respective interfaces is implemented using the wave propagation method.

According to some embodiments, the method includes the following steps:
  a) for each of the set illumination settings, propagating an illumination field produced by illuminating the object with an illumination setting into a diffraction image field on the detector on the basis of object parameters in order to obtain a simulated diffraction image field;
  b) for each of the set illumination settings, replacing the intensity values of this simulated diffraction image field with intensity values measured by the detector;
  c) ascertaining new object parameters by applying a back-calculation on the basis of these measured intensity values and the simulated diffraction image fields;
  d) carrying out step a) using the object parameters ascertained in step c).

According to some embodiments, new illumination fields are ascertained in step c), with, further, these new illumination fields being used in step d).

According to some embodiments, in step a) the simulated diffraction image field is ascertained as a superposition of simulated diffraction image fields respectively assigned to the interfaces or layers.

According to some embodiments, the measurement steps differ from one another further with respect to the wavelength of the electromagnetic radiation and/or with respect to the polarization of the electromagnetic radiation.

In an aspect, the disclosure provides an arrangement for characterizing an object in the form of a microlithographic wafer or mask, for carrying out a method having the features described above, including:
  an illumination device for illuminating the object from a plurality of illumination angles with electromagnetic radiation produced by a radiation source;
  a detector device for capturing a respective intensity distribution in a diffraction image produced by the object in a plurality of measurement steps, wherein these measurement steps differ from one another with respect to the illumination setting set by the illumination device, wherein the illumination device and the detector device are arranged on the same side of an object plane assigned to the object; and
  an evaluation device for determining at least one characteristic variable that is characteristic for the object on the basis of an iteratively performed comparison between the measurement values obtained within the scope of the measurement steps and model-based simulated values.

According to some embodiments, the illumination device includes a first mirror and a second mirror which is embodied as an ellipsoid mirror, wherein a first focus of the second mirror is situated on the first mirror.

According to some embodiments, the first mirror has a rotatable configuration.

According to some embodiments, the illumination device is configured as a Volterra optical unit, wherein the first mirror is a convex mirror. Here, in particular, the disclosure can include the principle of using a Volterra optical unit, known per se, not in conventional fashion as an imaging system but for illumination purposes.

According to some embodiments, the arrangement further includes a scanning device for carrying out a scanning movement of the object parallel to the object plane.

What the aforementioned realization of the illumination device may facilitate, for example even when the object (i.e., the mask to be characterized or the wafer to be characterized) is arranged away from the focus of the second mirror or ellipsoid mirror, is that each location or point on the object sees not only one illumination direction but all realized illumination directions. Moreover, the aforementioned setup can allow a comparatively homogeneous illumination of the detector device and hence, in turn, a homogeneous signal-to-noise ratio in relation to photon noise ("shot noise") to be obtained, with the consequence that only a substantially constant background has to be subtracted in the algorithm for reconstructing the object to be characterized from the measurement results obtained, aspects of which will be described in detail below.

According to some embodiments, the illumination device has a numerical aperture (NA) of at least 0.3, such as at least 0.4.

According to some embodiments, the radiation source is an HHG source (i.e., a radiation source for producing high harmonics). This can be advantageous in that the respective work wavelength can be selected from a substantially continuous spectrum, wherein the individual diffraction images can then be recorded individually for the respective work wavelengths and can be subsequently evaluated by the algorithm yet to be described below.

According to some embodiments, the electromagnetic radiation has a wavelength in the range from 1 nm to 15 nm.

According to some embodiments, the at least one specific characteristic variable describes the overlay of two structures produced in different lithography steps.

According to some embodiments, the at least one specific characteristic variable describes a CD value.

According to some embodiments, the detector device is arranged immediately downstream of the object in relation to the optical beam path. Expressed differently, there is no optical element or imaging system between the object and detector device in embodiments of the disclosure.

With respect to preferred configurations and aspects of the arrangement, reference is made to the explanations in conjunction with the method according to the disclosure.

Further configurations of the disclosure can be gathered from the description and the dependent claims.

BRIEF DESCRIPTION OF THE DRAWINGS

The disclosure is explained in greater detail below on the basis of exemplary embodiments illustrated in the accompanying figures, in which.

DETAILED DESCRIPTION OF PREFERRED EMBODIMENTS

Figure 1:
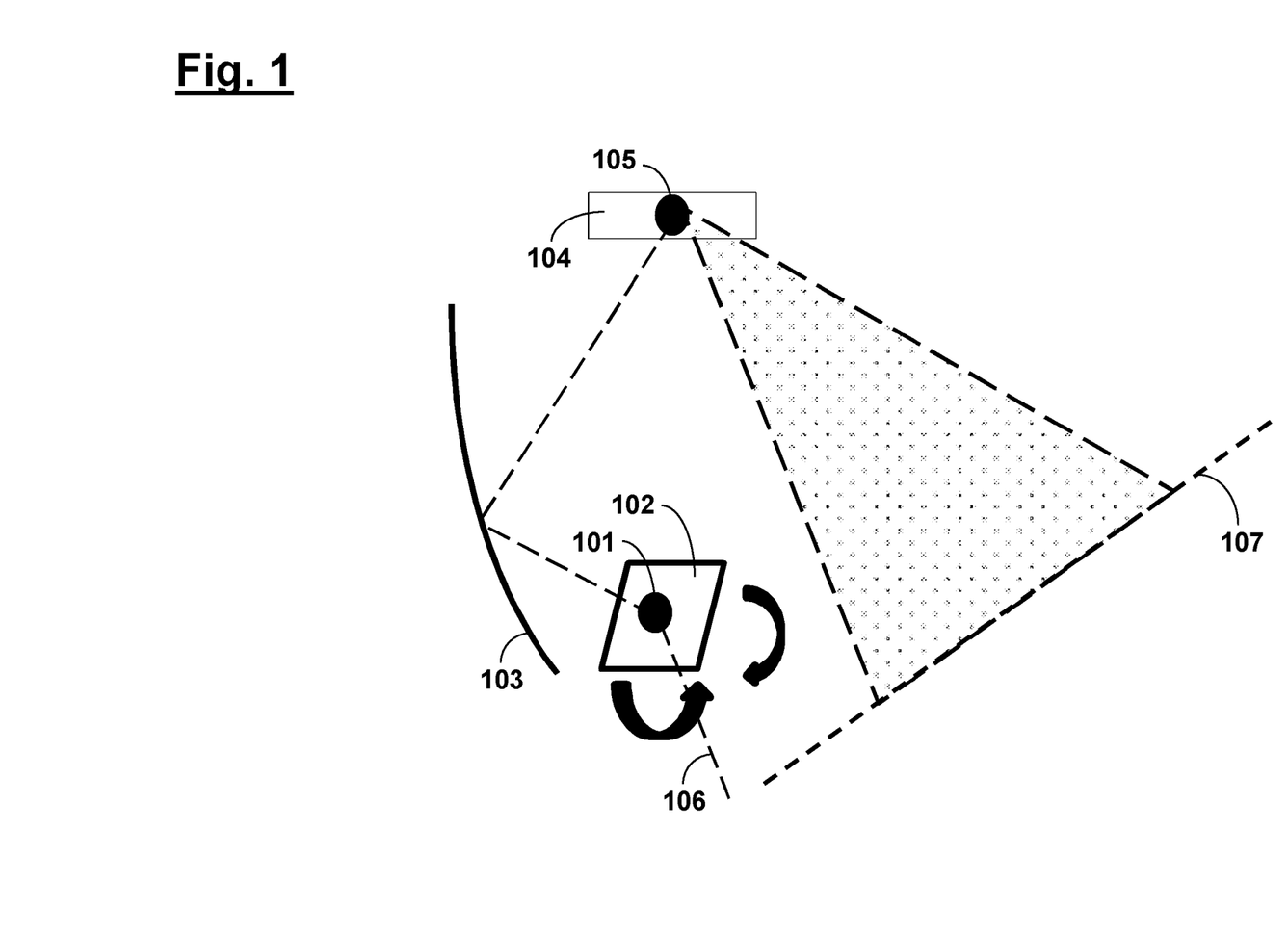
FIG. 1 shows a schematic illustration for explaining the setup and functionality of an arrangement according to the disclosure in a first embodiment.

FIG. 1 shows a schematic illustration for explaining the setup and functionality of an arrangement according to the disclosure in a first embodiment. The arrangement according to the disclosure serves to characterize a microlithographic wafer or mask, wherein this characterization is distinguished, in particular, by virtue of being carried out in three dimensions and in reflection, as explained below.

According to FIG. 1, an object 104 (i.e., a mask or a wafer) is illuminated by way of an illumination device in a first embodiment of this characterization, the illumination device including a rotatably configured first mirror 102 and a second mirror 103 which is configured as an ellipsoid mirror in this exemplary embodiment, wherein, according to FIG. 1, a first focus 101 of the second mirror 103 is situated on the first mirror 102 and wherein a second focus 105 of the second mirror 103 is situated on the object 104.

The electromagnetic radiation 106 that is incident on the first mirror 102 or steered by the latter on the second mirror 103 is x-ray radiation with a wavelength in the range of (1-13) nm, an HHG source (not illustrated) being used in this exemplary embodiment for the generation thereof. Rotating the first mirror 102 allows different illumination directions to be set when illuminating the object 104. The diffracted electromagnetic radiation 106 emanating from the object 104 strikes a detector device, which is arranged in a plane labeled by "107".

Figure 2:
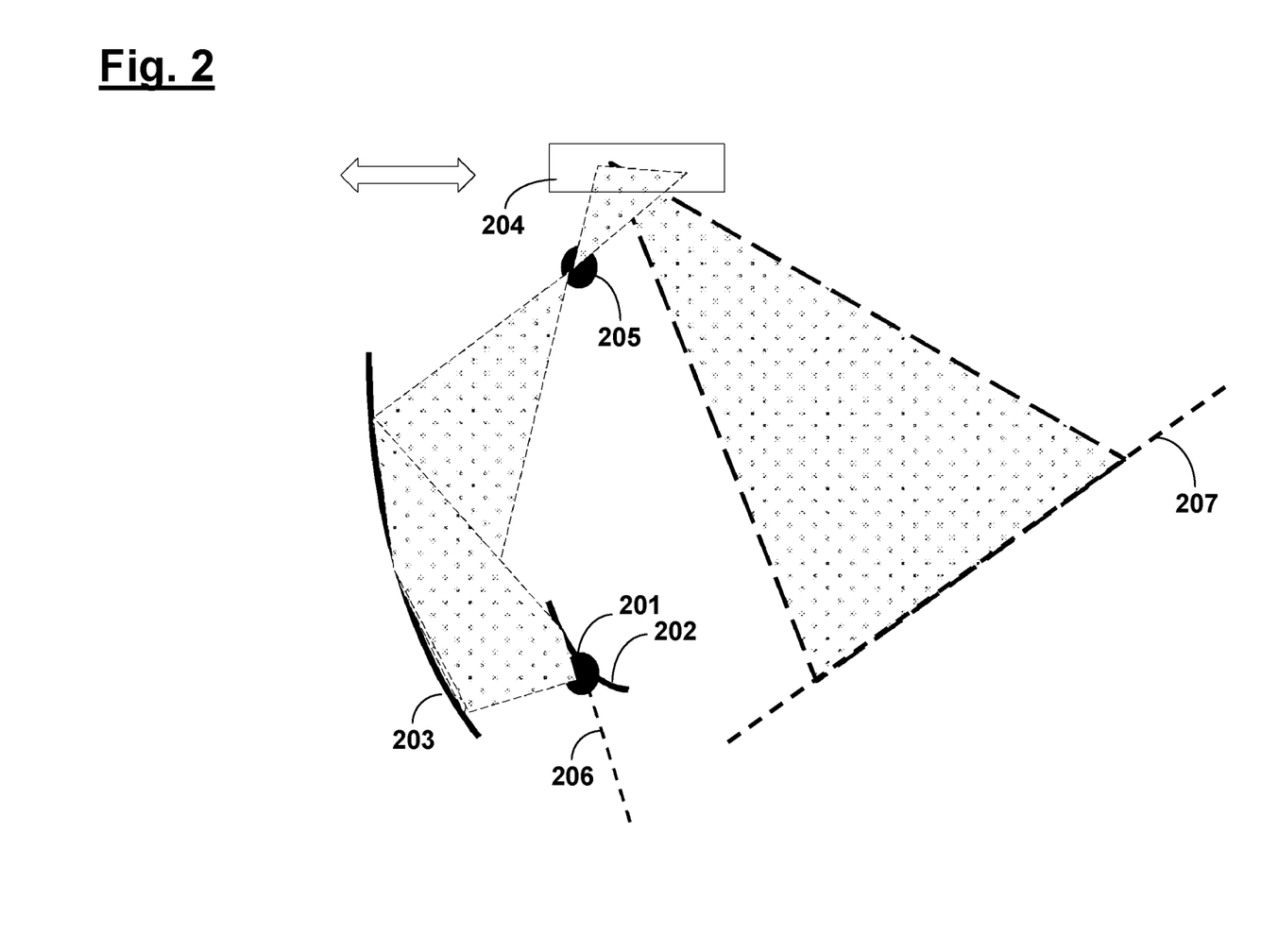
FIG. 2 shows a schematic illustration for explaining the setup and functionality of an arrangement according to the disclosure in a further embodiment.

FIG. 2 shows a further embodiment of an arrangement according to the disclosure, wherein components analogous or substantially functionally identical to FIG. 1 are designated by reference numerals increased by "100".

According to FIG. 2 and in contrast with FIG. 1, the illumination device used to illuminate the object 204 is configured as a Volterra optical unit, which includes a first mirror 202 which is embodied as a convex mirror and a second mirror 203 which is embodied as an ellipsoid mirror. Furthermore, in contrast to the arrangement of FIG. 1, the object 202 is not situated in a focus (denoted by "205") of the second mirror 203 in accordance with FIG. 2. To take account of these circumstances, a scanning movement of the object 204 is carried out in accordance with FIG. 2, in a manner parallel to the object plane of the object 204 as indicated by the plotted double-headed arrow; as a result, the individual points or locations on the object 204 see different illumination devices.

However, the disclosure is not restricted to the arrangement of the object 204 away from the focus 205, and so embodiments in which the focus 205 of the second mirror 203 is located on the object 204 should also be considered to be included by the present application.

The scanning movement of the object 204 parallel to the object plane, implemented in accordance with FIG. 2, can be further advantageous in that an increased accuracy (on account of a numerical calibration) can be expediently obtained for the further evaluation or the performed algorithm should there be an overlap of the illumination fields generated in the individual scanning positions.

A further advantage of the setup described on the basis of FIG. 2 can involve the fact that the signal-to-noise ratio is substantially constant for the individual locations illuminated on the detector device (camera pixels), and so merely a substantially constant background is subtracted within the scope of the evaluation according to the disclosure or the reconstruction algorithm to be carried out.

Now, possible evaluations of the measurement results obtained with the setup of FIG. 1 or FIG. 2 are described below with reference to the schematic illustration of FIG. 3 and FIG. 4.

Figure 4:
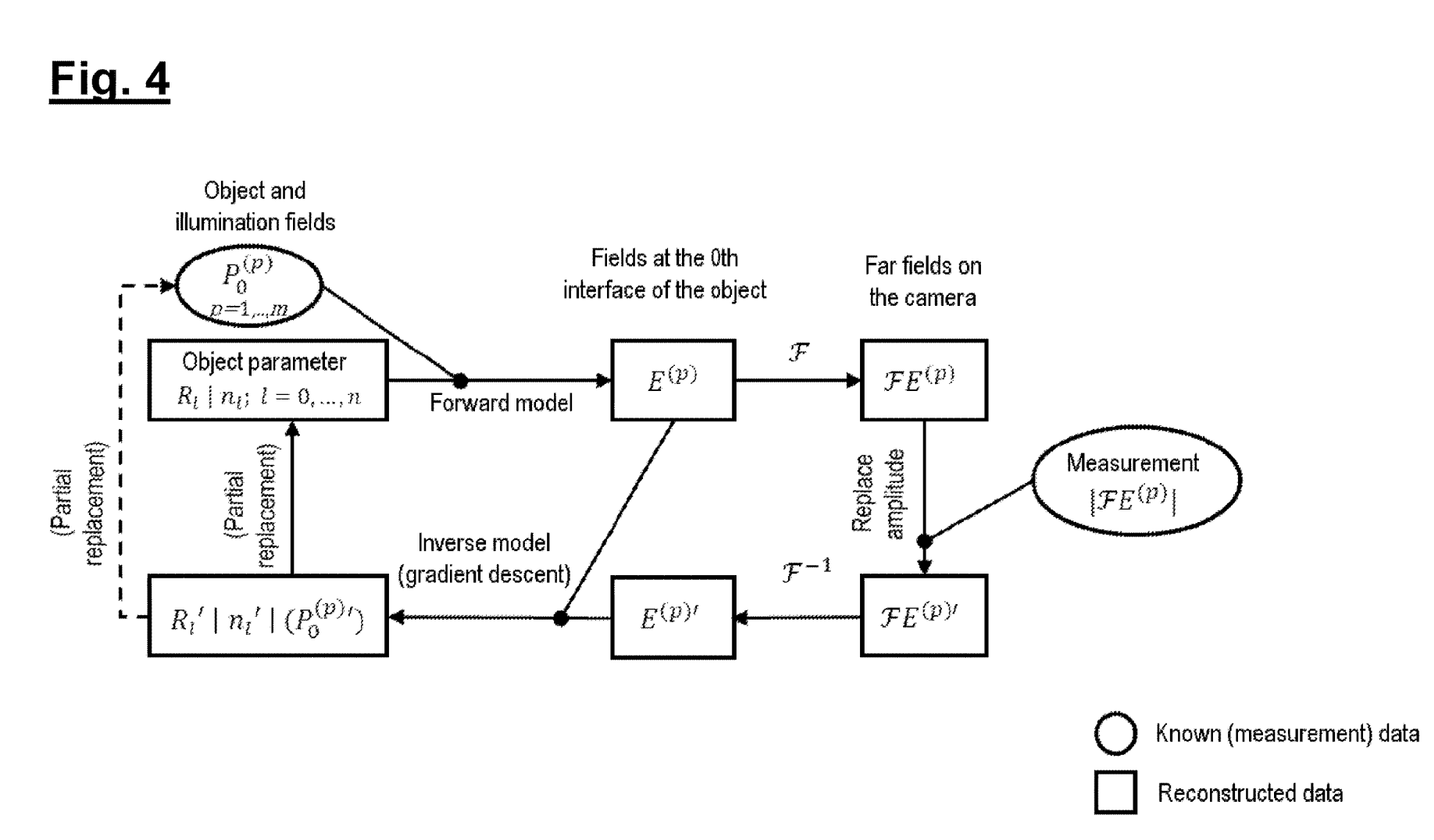
FIG. 4 shows a schematic illustration for explaining an embodiment of a method according to the disclosure.

The disclosure herein contains the concept schematically illustrated in FIG. 4 of by way of an iteration performing a repeated comparison between model-based simulated values and the measurement values captured with the aid of the detector device (referred to as "camera" in FIG. 4) within the scope of the measurement according to the disclosure, wherein, in a manner known per se and in a multiplicity of iteration steps, there respectively is in repeated fashion a forward calculation or forward simulation (corresponding to the model-based calculation of a diffraction image) and an inverse calculation (corresponding to a correction of the underlying model on the basis of the actually obtained measurement results).

Here, the object structures to be ascertained are reconstructed iteratively as per FIG. 4 from the input data records, by virtue of a diffraction image initially being calculated from the illumination field (denoted by "$P_0^{(p)}$" in FIG. 4) and estimators of the structure which are modeled by object parameters (illustrated in the rectangle top left in FIG. 4) ("forward model"), and, secondly, the error in relation to the actual diffraction image being used to correct the estimation parameters ("inverse model").

This inverse model can include a known gradient descent method or a direct, gradient-based estimation. Forward and inverse model are applied alternately in iterative fashion until the error between calculated and measured diffraction image drops below a given limit.

According to FIG. 4, an iteration cycle includes the following steps in this case:

a) Initially, the illumination fields $P_0^{(p)}$ for the given illumination settings p=1, ..., m and the object parameters described in more detail below are used in accordance with a forward model detailed below to simulate fields $E^{(p)}$ at the interface of object and air or vacuum and, from this, simulate far fields $\mathcal{F}E^{(p)}$ (also referred to as "diffraction fields") at the detector (e.g., a CCD camera) by way of free space propagation (e.g., via a Fourier transform).

b) The amplitudes of the simulated far fields are replaced by measured amplitudes for the respective illumination setting. The result is a new far field $\mathcal{F}E^{(p)\prime}$.

c) Object parameters (and optionally the illumination fields) are reconstructed from the far field $\mathcal{F}E^{(p)}$ and $\mathcal{F}E^{(p)\prime}$ for all illumination settings p=1, . . . , m by way of an inverse model described in more detail below.

d) Some of the object parameters (and optionally illumination fields) reconstructed in step c) are used as a new estimator for step a).

Here, the model description of the object to be characterized (i.e., the mask or the wafer) is respectively based on a multiple layer model, in which the object, for the purposes of the model, is "decomposed" into a plurality of mutually parallel layers ($M_1$ . . . $M_n$) of thickness $\Delta z$, wherein the refractive index of the object varies parallel to the object plane (i.e., in the x-direction and/or y-direction) but is constant within the individual layers in the direction perpendicular to the object plane (z-direction).

The interfaces between the layers or between a layer and air or a layer and substrate are assigned location-dependent reflectivities ($R_0$ . . . $R_n$), the determination of which is part of the algorithm. Here, let $R_0$ be the reflectivity between air and the first layer $M_1$, $R_i$ be the reflectivity between the i-th layer $M_i$ and the i+1-th layer $M_{i+1}$, and $M_n$ be the reflectivity between the n-th layer $M_n$ and the substrate. Furthermore, let $P^{(p)}$ be the illumination field at the interface between the first layer $M_1$ and air in the p-th illumination setting.

The forward model of all algorithms can then be described with reference to the schematic illustration in FIG. 3 by way of the following propagation rule:

The field reflected at the l-th interface is $P_l^{(p)} \cdot R_l$ at this interface for the p-th illumination setting, the transmitted field at this interface is $P_l^{(p)} \cdot (1-R_l)$, where $P_0^p = P_0^{(p)} = P^{(p)}$ (illumination field) applies for l=0, i.e., the air-object boundary layer. All fields here are complex functions (or more generally E-vector valued functions) of the interface.

The field $P_l^{(p)} \cdot (1-R_l)$ transmitted at the l-th interface is propagated to the (l+1)-th interface by a model-dependent Fresnel propagator $J_l$:

$$P_{l+1}^{(p)} = \tilde{J}_l(P_l^{(p)}) := J_l((1-R_l) \cdot P_l^{(p)}) \quad (1)$$

For x-rays, $R_l$ is very small, and so the approximation $P_{l+1}^{(p)} = J_l(P_l^{(p)})$ can be used. The far field $\mathcal{F}E^{(p)}$ from the forward model, the intensity of which describes the expected diffraction image in k-space (see below) for the illumination setting p, is given by a diffraction integral $\mathcal{F}$ (the Fourier transform for Fraunhofer diffraction) of the sum of the reflected and propagated fields:

$$E^{(p)} := R_0 P^{(p)} + \tilde{J}_1^r (R_1 P_1^{(p)}) + \tilde{J}_1^r \tilde{J}_2^r (R_2 P_2^{(p)}) + \ldots + \tilde{J}_1^r \ldots \tilde{J}_n^r (R_n P_n^{(p)}) \quad (2)$$

Here:

$$\tilde{J}_l^r(P) := (1-R_{l-1}) J_l^*(P)$$

Figure 3:
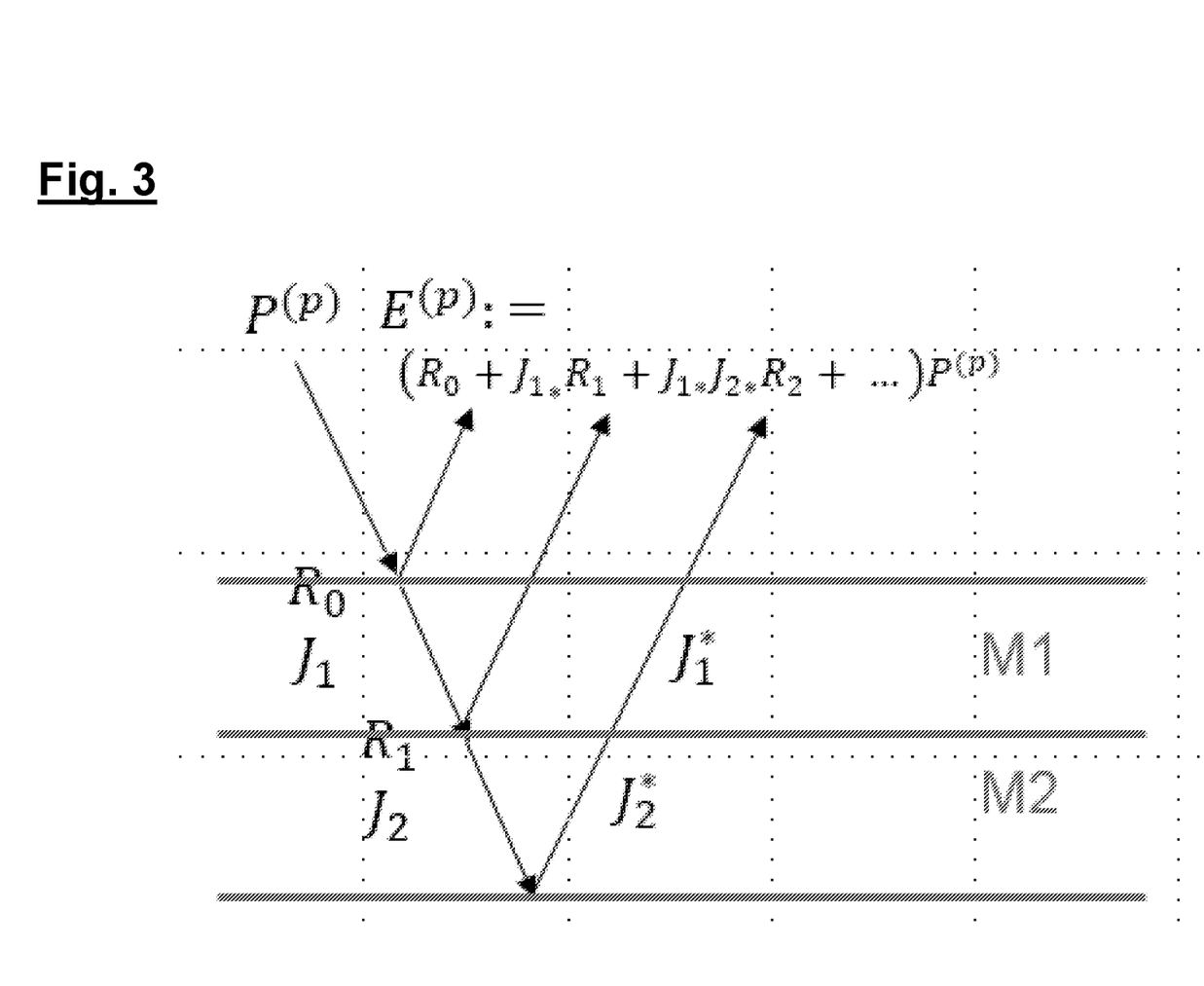
FIG. 3 shows a schematic illustration for explaining models used in embodiments of the disclosure.

And $J_l^*$ denotes the propagator from $M_{l+1}$ to $M_l$, which will match $J_l$ in the following due to the z-invariance of the layers and the reversal of the z-direction in reflection. Once again, in the approximation of small reflectivities of equation (2), this yields the following approximation:

$$E^{(p)} \le (R_0 P^{(p)} + J_{1*}(R_1) + J_1 J_{2*}(R_2) + \ldots + J_{1*}, \ldots J_{2*}(R_n))(P^{(p)}), \quad (2')$$

which is illustrated by way of example in FIG. 3, where $$J_*(R)(P) := J^*(RJ(P)).$$

The k-space usually parameterizes the far field, i.e., the diffracted field on an "infinitely" extended sphere, at the center of which the object lies, as follows: First, the sphere radius is normalized to $2 \cdot \pi$ times the inverse value of the wavelength, then the thus normalized sphere is projected onto the 0th interface of the object (xy-plane). Points in k-space are therefore pupil coordinates which describe the diffraction directions and the diffraction integral $\mathcal{F}$ in the case of Fraunhofer diffraction is $$(\mathcal{F}E)(k) := E(x) \exp \int (-ik \cdot x) dx_1 dx_2 \quad (3)$$

In the following, three different configurations of this multiple layer model (forward model), i.e., the relationship between the $P_l^{(p)}$ and $J_l$, are described in more detail using the model parameters of the examined object. The inverse model in these configurations is given by a gradient descent via the difference between the $E^{(p)}$-fields simulated in the forward model and the $E^{(p)\prime}$-fields modified by the measurement, or more directly by the "inverse sensitivity", as described in more detail below. Here, the measured far field $\mathcal{F}E^{(p)\prime}$ is determined from the measured intensity $I^{(p)}$ and the forward computed far field $\mathcal{F}E^{(p)}$ in the p-th illumination setting as follows:

$$\mathcal{F}E^{(p)\prime} := \left( \sqrt{I^{(p)}} \frac{\mathcal{F}E^{(p)}}{|\mathcal{F}E^{(p)}|} \right) \quad (4)$$

Here, the measured intensity $I^{(p)}$ has been suitably transformed into k-space, cf., e.g., Dennis F. Gardner et al.: "*High numerical aperture reflection mode coherent diffraction microscopy using off-axis apertured illumination*", 2012, Vol. 20, No. 17, OPTICS EXPRESS 19050.

n-model:

The "n-model" reconstructs the 3d refractive index profile of the structure as follows: Each layer $M_l$ is described by a complex refractive index $n_l(x,y)$, which is constant in the z-direction. The Fresnel propagator is then given by $$J_l(E_l) := \mathcal{F}^{-1}(\exp(ik_z(n_l)\Delta z) \cdot \mathcal{F}E_l)) \quad (5)$$

$$J_l^* = J_l$$

Here, $$k_z(n_l) = \sqrt{n_l^2 \frac{2\pi}{\lambda_0} - (k_x^2 + k_y^2)}.$$

The Fresnel propagator for inhomogeneous media is very complicated to calculate numerically as a 2-parameter family of 2d Fourier transforms, and so the possible structures can be reduced to linear combinations of a "sparse" basis in the sense of the "sparsity" compression approach. The Fresnel propagators of this "sparse" base can then be stored and called in the form of a database. The preferred solution for calculating the Fresnel propagator (5) is the WPM algorithm, in particular, described in S. Schmidt et al.: "*Wave optical modeling beyond the thin-element approxi-* mation", OPT. EXPRESS, Vol 24 No. 26. Here, the refractive index $n_l$ in the 1-th layer is described as a linear combination of a few binary functions $\mathbb{R}^2 \to \{0,1\}$, and so the Fresnel propagator becomes the corresponding linear combination of Fresnel propagators (possibly modified by absorption factors) in homogeneous media. The latter propagators can then each be calculated using a single fast Fourier transform and its inverse.

The reflectivities $R_l$ are then approximated from the $n_l$ via the Fresnel equations. In the event that the illumination directions do not exceed the Brewster angle, the following applies:

$$R_l \approx \frac{(n_l - n_{l+1})}{(n_l + n_{l+1})} \to \frac{1}{2}(n_l - n_{l+1}) \, f\ddot{u}r \, n \to 1; \text{Im}(n_l) \geq 0 \quad (6)$$

Alternatively, the reflectivities $R_l$ themselves can be a constituent part of the reconstruction, the approximated Fresnel equation (6) serving as a reference and a norm of the difference being restricted or otherwise controlled.

The forward model is determined according to equation (2). The inverse model for the iterative correction $n_l'$ of the $n_l$ is given by gradient descent $$n_l' := n_l - \alpha \left( \frac{\partial f(E^{(p)'} - E^{(p)}, p = 1, \ldots, m)}{\partial n_l} \right) \quad (7)$$

for a descent increment $\alpha > 0$ and a positive error function f (e.g., the L2 norm square $f(g) := \int g^2(x) d^2 x$) in the differences $E^{(p)'} - E^{(p)}$ or more directly through the "inverse sensitivity"

$$n_l' := n_l + \left( \frac{\partial E^{(1)} \ldots E^{(m)}}{\partial n_l} \right)^{-1}_{regularized} (E^{(1)'} - E^{(1)}, \ldots, E^{(m)'} - E^{(m)}) \quad (8)$$

where "regularized" means a regularization rule (e.g., via singular value decomposition) for non-invertible matrices. Equation (8) is an adaptation of the "difference map" introduced in Thibault et al.: "*Probe retrieval in ptychographic coherent diffractive imaging*", Ultramicroscopy, 2009; 109 (4): 338-43. doi: 10.1016/j.ultramic.2008.12.011, while the gradient descent method according to equation (7) is used, for instance, in the algorithms of J. Rodenburg, presented, for example, in A. Maiden, M. Humphry, and J. Rodenburg: "*Ptychographic transmission microscopy in three dimensions using a multi-slice approach*", JOSA A, Vol. 29, No. 8, 2012, or T. Koch: "*General framework for quantitative three-dimensional reconstruction from arbitrary detection geometries in TEM*", PHYSICAL REVIEW B 87, 184108 (2013).

Here and in the following models, all equations should be solved simultaneously for all illumination settings p=1, ..., m and all layers l=1, ..., n. The assumption can be made here, for example for the configurations in FIGS. 1 and 2, that the illumination fields substantially only differ by an offset $\Delta x^{(p)}$ or a tilt $\Delta k^{(p)}$, and so $$P^{(p)}(x) := P(x + \Delta x^{(p)}) \exp(i \Delta k^{(p)} x) \quad (9)$$

applies here for all illumination settings p=1, ..., m and a reference illumination field P. In other embodiments, the illumination settings can differ by defocusing, for example, and can thus be parameterized by the relative position of the focal plane.

R Model:

The "R-model" reconstructs an effective 3d reflectivity of the structure analogous to the 1st Born approximation as follows: Here the model is described exclusively by the reflectivities $R_l$, the latter thus representing all effective model parameters. The Fresnel propagators are then given by free propagation between the boundary layers, i.e., $$J_l := \mathcal{F}^{-1} \exp(ik_z \Delta z) \cdot \mathcal{F}$$

$$J_l^* = J_l \quad (10)$$

The inverse model thus arises analogously to the n-model as $$R_l' := R_l - \alpha \left( \frac{\partial f(E^{(p)'} - E^{(p)}, p = 1, \ldots, m)}{\partial R_l} \right) \quad (11)$$

in the gradient descent method or as $$R_l' := R_l + \left( \frac{\partial E^{(1)} \ldots E^{(m)}}{\partial R_l} \right)^{-1}_{regularized} (E^{(1)'} - E^{(1)}, \ldots, E^{(m)'} - E^{(m)}) \quad (12)$$

for using the inverse sensitivity.

For weak reflectivities R, the approximation (2') of equation (2) can be used again. This corresponds to the 1st Born approximation, i.e., the assumption of a single interaction (here: a diffractive reflection) in contrast to multiple scattering. For a single illumination direction k_in, the diffraction image in k-space then is precisely the 3d Fourier transform of the 3d structure (more precisely here, its effective 3d reflectivity R) evaluated at kk_in). This model is based on tomographic methods and, in particular, on the reconstruction via a Radon transform, but it is extended here to the case of any coherent illumination setting in reflection. The model also defines the 3d transfer function (FIG. 5): The apertures limit the possible k, k_in and thus the "transferred" differences k-k_in to the area outlined in black in FIG. 5.

In the case of the R model, the known 3d Fourier transform can be used more directly in forward calculation instead of the slice mode; however, this then limits the inverse calculation to the usual gradient descent method. In this respect, exemplary reference is made to Wouter Van den Broek and Christoph T. Koch: "General framework for quantitative three-dimensional reconstruction from arbitrary detection geometries in TEM", PHYSICAL REVIEW B 87, 184108 (2013).

R,P or n,P or R,P,n Model:

These are analogous to the R-model, with the inverse model additionally correcting the illumination field according to the literature cited there. By way of example, the assumption can be made in the configurations in FIGS. 1 and 2 that the illumination fields for the illumination setting (p) according to equation (9) emerge from a reference illumination field P by way of a tilt and an offset. In this case, the object parameters to be reconstructed $n_l$, $R_l$ should be supplemented in equations (7), (8), (11), (12) by the reference setting P or a parameterization of the same by a few parameters (in the sense of a direct addition of vectors).

Likewise, offset and tilt $\Delta x^{(p)}$, $\Delta k^{(p)}$ setting parameters from equation (9) can be corrected iteratively, for example via a gradient descent.

If the intensity of the illumination field is measured separately, the measured amplitude can be replaced directly, analogous to the conventional Gerchberg-Saxton algorithm.

Even though the disclosure has been described on the basis of specific embodiments, numerous variations and alternative embodiments will be apparent to the person skilled in the art, for example through combination and/or exchange of features of individual embodiments. Accordingly, it goes without saying for the person skilled in the art that such variations and alternative embodiments are also encompassed by the present disclosure, and the scope of the disclosure is restricted only within the meaning of the appended patent claims and the equivalents thereof.

What is claimed is:

1. A method, comprising:
    using an illumination device to illuminate an object with electromagnetic radiation;
    in each of a plurality of measurement steps that differ from each other with respect to an illumination setting set by the illumination device, using a detector device to capture a respective intensity distribution in a reflected diffraction image produced by illuminating the object; and
    determining a variable that is characteristic for the object based on iteratively comparing the measurement values obtained in the measurement steps and model-based simulated values,
    wherein:
    the model-based simulated values are based on a model in which the object is modeled as a multiple layer structure comprising layers that are respectively separated from one another by an interface, a location-dependent reflectivity being assigned to the interfaces; and the object comprises a member selected from the group consisting of a microlithographic wafer and a microlithographic mask; and
    the method further comprises:
    a) for each of the set illumination settings, propagating an illumination field produced due to illuminating the object with the respective illumination setting into a diffraction image field on the detector based on object parameters to obtain a simulated diffraction image field;
    b) for each of the set illumination settings, replacing the intensity values of the respective simulated diffraction image field with intensity values measured by the detector;
    c) determining new object parameters by applying a back-calculation on the basis of these measured intensity values and the simulated diffraction image fields; and
    d) performing a) using the object parameters determined in c).

2. The method of claim 1, wherein:
    c) further comprises ascertaining new illumination fields; and
    d) further comprises using the new illumination fields.

3. The method of claim 2, wherein a) comprises ascertaining the simulated diffraction image field as a superposition of simulated diffraction image fields respectively assigned to the interfaces or layers.

4. The method of claim 3, wherein the measurement steps differ from one another in respect of the wavelength of the electromagnetic radiation and/or in respect of the polarization of the electromagnetic radiation.

5. The method of claim 4, wherein the illumination device and the detector device are arranged on the same side of the object.

6. The method of claim 3, wherein the illumination device and the detector device are arranged on the same side of the object.

7. The method of claim 2, wherein the measurement steps differ from one another in respect of the wavelength of the electromagnetic radiation and/or in respect of the polarization of the electromagnetic radiation.

8. The method of claim 7, wherein the illumination device and the detector device are arranged on the same side of the object.

9. The method of claim 2, wherein the illumination device and the detector device are arranged on the same side of the object.

10. The method of claim 1, wherein a) comprises ascertaining the simulated diffraction image field as a superposition of simulated diffraction image fields respectively assigned to the interfaces or layers.

11. The method of claim 10, wherein the measurement steps differ from one another in respect of the wavelength of the electromagnetic radiation and/or in respect of the polarization of the electromagnetic radiation.

12. The method of claim 11, wherein the illumination device and the detector device are arranged on the same side of the object.

13. The method of claim 10, wherein the illumination device and the detector device are arranged on the same side of the object.

14. The method of claim 1, wherein the measurement steps differ from one another in respect of the wavelength of the electromagnetic radiation and/or in respect of the polarization of the electromagnetic radiation.

15. The method of claim 14, wherein the illumination device and the detector device are arranged on the same side of the object.

16. The method of claim 1, further comprising reconstructing a three-dimensional refractive index profile of the object.

17. The method of claim 1, further comprising reconstructing interface reflectivities in the multiple layer structure of the object.

18. The method of claim 1, further comprising reconstructing an illumination field produced by the illumination device.

19. The method of claim 1, further comprising using wave propagation to implement a propagation between two respective interfaces.

20. The method of claim 1, wherein the illumination device and the detector device are arranged on the same side of the object.

* * * * *

UNITED STATES PATENT AND TRADEMARK OFFICE
CERTIFICATE OF CORRECTION

PATENT NO. : 11,269,260 B2
APPLICATION NO. : 17/164747
DATED : March 8, 2022
INVENTOR(S) : Carl et al.

It is certified that error appears in the above-identified patent and that said Letters Patent is hereby corrected as shown below:

On the Title Page

Page 2, Column 2, Line 21, delete "Sub-wafelength" insert -- Sub-wavelength --.

In the Specification

Column 7, Line 29, delete "$M_1$" insert -- $M_i$ --.

Column 7, Line 29, delete "$M_{1+1}$" insert -- $M_{i+1}$ --.

Column 7, Line 63, delete "$M_{/+1}$ to $M_/$" insert -- $M_{1+1}$ to $M_1$ --.

Column 8, Line 19, delete "$J_/$" insert -- $J_1$ --.

Column 8, Line 47, delete "$f_i(E_i) := \mathcal{F}^{-1}(\exp(ik_z(n_i)\Delta z) \cdot \mathcal{F}\, E_i)))$," insert -- $f_i(E_i) := \mathcal{F}^{-1}(\exp(ik_z(n_i)\Delta z) \cdot \mathcal{F}\, E_i)$ --.

Column 10, Line 40, delete "kk_in)." insert -- k-k_in). --.

Signed and Sealed this
Eighteenth Day of October, 2022

*Katherine Kelly Vidal*

Katherine Kelly Vidal
*Director of the United States Patent and Trademark Office*